US012740064B2

(12) United States Patent
Fu et al.

(10) Patent No.: US 12,740,064 B2
(45) Date of Patent: Sep. 15, 2026

(54) LOW-COST MASK PUNCH FLOW

(71) Applicant: Intel NDTM US LLC, Santa Clara, CA (US)

(72) Inventors: Xin Fu, Dalian (CN); Peng Li, Dalian (CN); Prasanna Srinivasan, Santa Clara, CA (US)

(73) Assignee: INTEL NDTM US LLC, Santa Clara, CA (US)

( * ) Notice: Subject to any disclaimer, the term of this patent is extended or adjusted under 35 U.S.C. 154(b) by 274 days.

(21) Appl. No.: 18/196,545

(22) Filed: May 12, 2023

(65) Prior Publication Data

US 2023/0354611 A1 Nov. 2, 2023

(51) Int. Cl.

| | |
|---|---|
| ***H10B 43/35*** | (2023.01) |
| ***H10B 41/27*** | (2023.01) |
| ***H10B 41/35*** | (2023.01) |
| ***H10B 43/27*** | (2023.01) |
| ***H10B 80/00*** | (2023.01) |
| ***H10W 20/41*** | (2026.01) |
| ***H10W 20/42*** | (2026.01) |

(Continued)

(52) U.S. Cl.

CPC ............. *H10B 43/35* (2023.02); *H10B 41/27* (2023.02); *H10B 41/35* (2023.02); *H10B 43/27* (2023.02); *H10B 80/00* (2023.02); *H10W 20/42* (2026.01); *H10W 20/435* (2026.01); *H10W 90/00* (2026.01); *H10W 90/297* (2026.01)

(58) Field of Classification Search

CPC ........ H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | | |
|---|---|---|---|---|
| 2013/0137266 A1* | 5/2013 | Chen | ................ | H01L 21/32139 438/694 |
| 2019/0027490 A1* | 1/2019 | Shin | ...................... | H10B 41/40 |
| 2021/0028058 A1* | 1/2021 | Kim | ................. | H01L 21/76877 |

* cited by examiner

*Primary Examiner* — William B Partridge
*Assistant Examiner* — Gustavo G Ramallo
(74) *Attorney, Agent, or Firm* — Morgan, Lewis & Bockius LLP

(57) ABSTRACT

Methods and apparatus for low-cost punch through flows. Pillar recesses are formed in a semiconductor structure comprising a stack of layers. A negative photoresist coating is applied over regions containing the plurality of pillar recesses. Using a mask, the negative photoresist is in regions in which dummy pillars are to be formed to causing the negative photoresist to polymerize and become insoluble to a developer. A developer is then applied to the semiconductor structure to dissolve the negative photoresist in the pillar recesses that are not exposed. A punch through operation is then performed using an etchant to punch through the bottoms of the pillar recesses that are not covered by the polymerized photoresist, while the bottoms of the pillar recesses that are covered are not punched through. The semiconductor process flow may be used in memory device, such as but not limited to 3D NAND devices.

20 Claims, 17 Drawing Sheets

(51) Int. Cl.

| | |
|---|---|
| ***H10W 90/00*** | (2026.01) |
| *H10W 90/20* | (2026.01) |

INSULATOR 326-A

CAP 332

INSULATOR 326-B

CIRCUIT ELEMENTS (TIERS) 322-A

CHANNEL 324

CIRCUIT ELEMENTS (TIERS) 322-B

INSULATOR 314-A

INSULATOR 314-B

SOURCE 312

SUBSTRATE 310

300

*Fig. 4*
DECK
440
CIRCUIT ELEMENTS
(TIERS)
442-A
CHANNEL
444
CIRCUIT ELEMENTS
(TIERS)
442-B
INSULATOR
426-A
STOP
LAYER
430
INSULATOR
426-B
DECK
420
CIRCUIT ELEMENTS
(TIERS)
422-A
CHANNEL
424
CIRCUIT ELEMENTS
(TIERS)
422-B
INSULATOR 414-A
INSULATOR 414-B
SOURCE 412
SUBSTRATE
410
400

BITLINE 540

INSULATOR 526-A

STOP LAYER 530

INSULATOR 526-B

MEMORY ELEMENTS (TIERS) 522-A

CHANNEL 524

MEMORY ELEMENTS (TIERS) 522-B

INSULATOR 514-A

INSULATOR 514-B

SOURCE 512

SUBSTRATE 510

LOW-COST MASK PUNCH FLOW

RELATED APPLICATION

This application claims the benefit of priority to Patent Cooperation Treaty (PCT) Application No. PCT/CN2023/089449, filed Apr. 20, 2023. The entire content of that application is incorporated by reference.

BACKGROUND INFORMATION

Three-dimensional (3D) NAND (not AND) technologies are commonly used to create nonvolatile (NV) storage devices, such as solid-state drives (SSDs). Reference to 3D NAND can more specifically refer to NAND flash. Unlike convention 2D memory devices, 3D NAND memory devices have one or more decks comprising tiers of circuit elements that are stacked on top of one another. The circuit elements are connected via channels in vertical pillars having high depth to width aspect ratios, such as shown in the scanning electron microscope images in FIG. 8.

Fabricating such semiconductor structures (e.g., semiconductor circuit dies) creates a number of challenges. One problem is with punch through, under which a portion of the channel material in the pillars punches through a layer at the bottom of the pillars. When combined with other aspects (e.g., dry etch one side distortion or tier expansion/staircase shrink tilt), some weak point regions in the die may result that will transfer some etch through and/or damage the die to the point it is unusable, resulting in a significant yield loss.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 5 is a block diagram of an embodiment of a stacked memory circuit in which a selectively created channel cap provides a contact between the channel and a bitline;

DETAILED DESCRIPTION

Figure 1A:
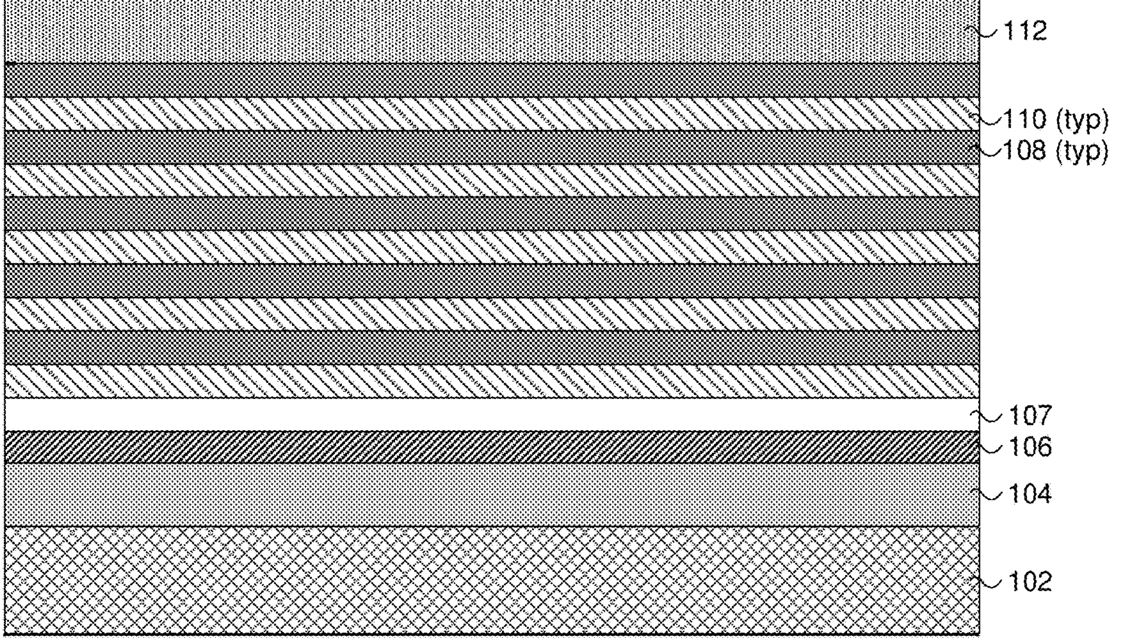
FIGS. 1*a*-1*h* illustrate semiconductor structures corresponding to processing operations used to fabricate a semiconductor structure with dummy pillars using a low cost mask punch through, according to one embodiment.

Embodiments of methods and apparatus for low-cost punch through flows are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

Figure 1B:
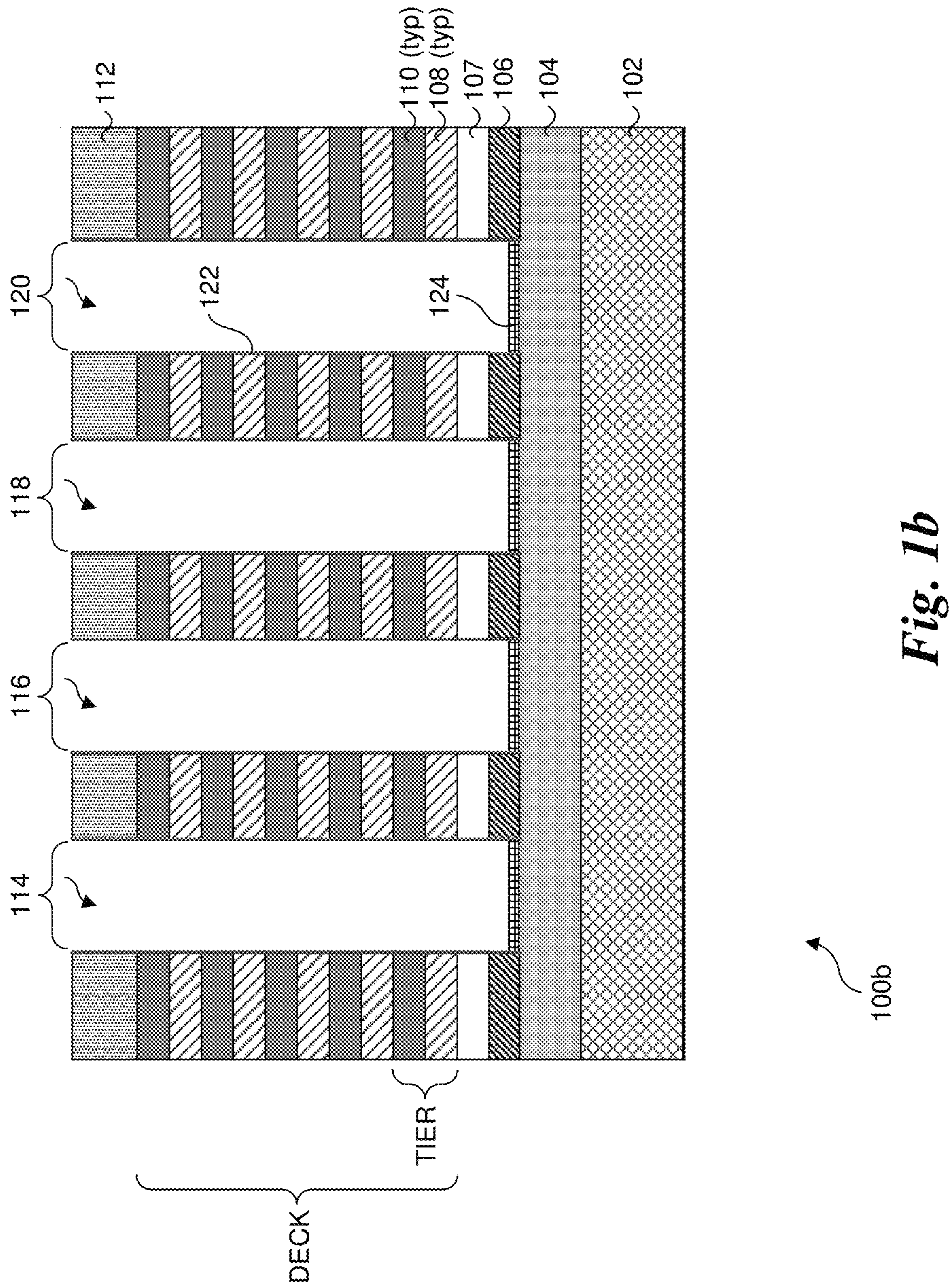
Figure 1C:
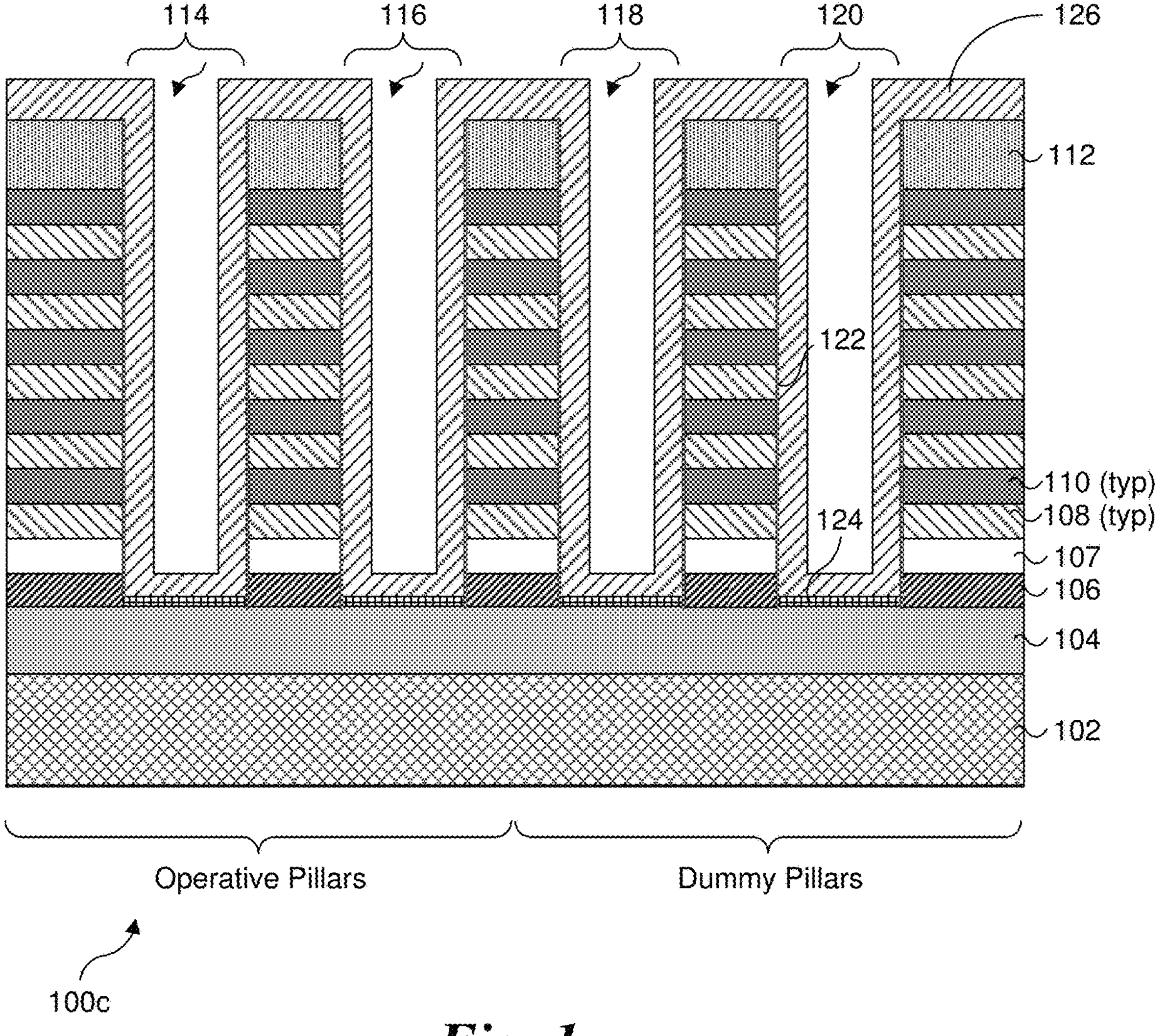
Figure 1D:
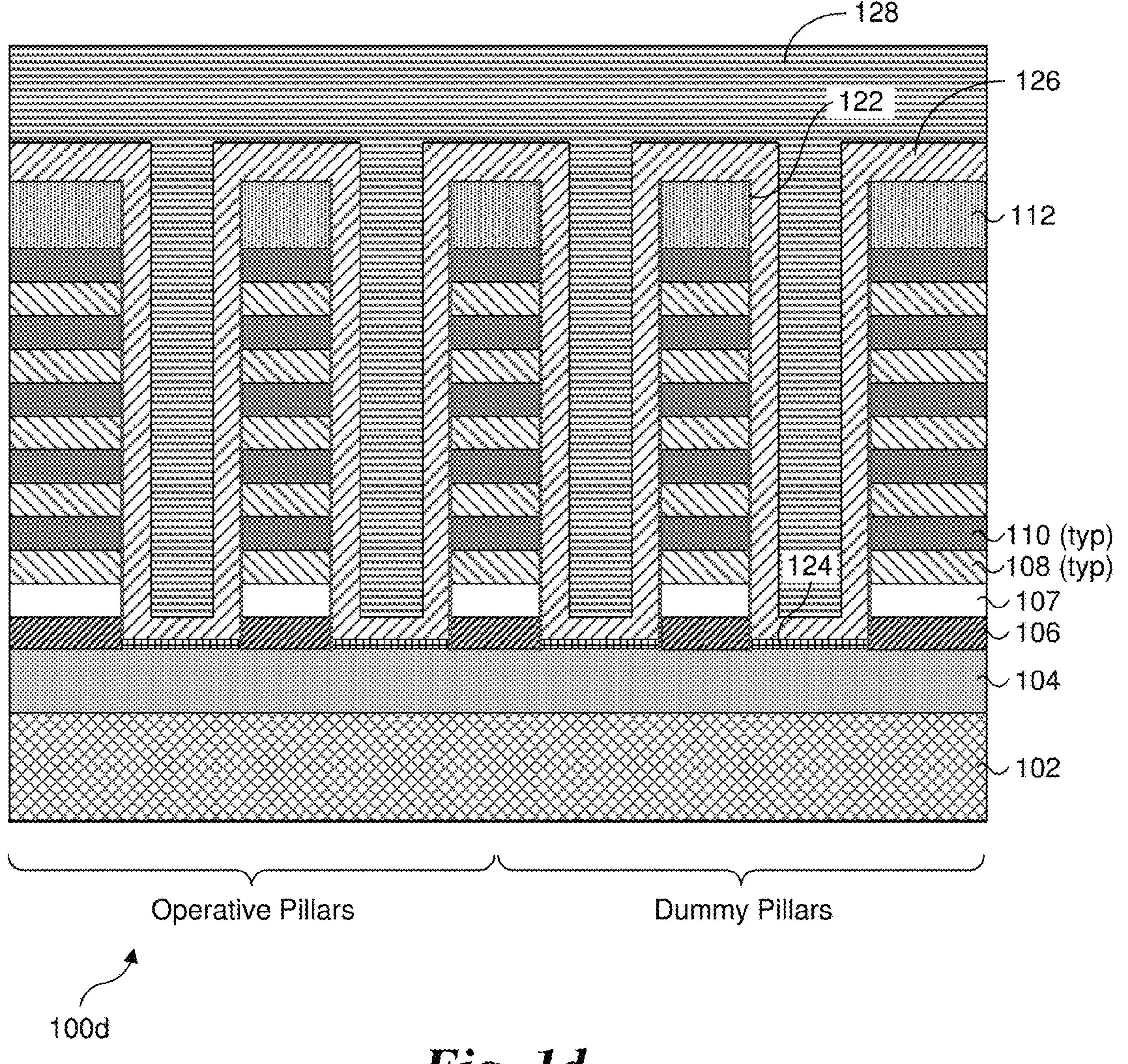
Figure 1E:
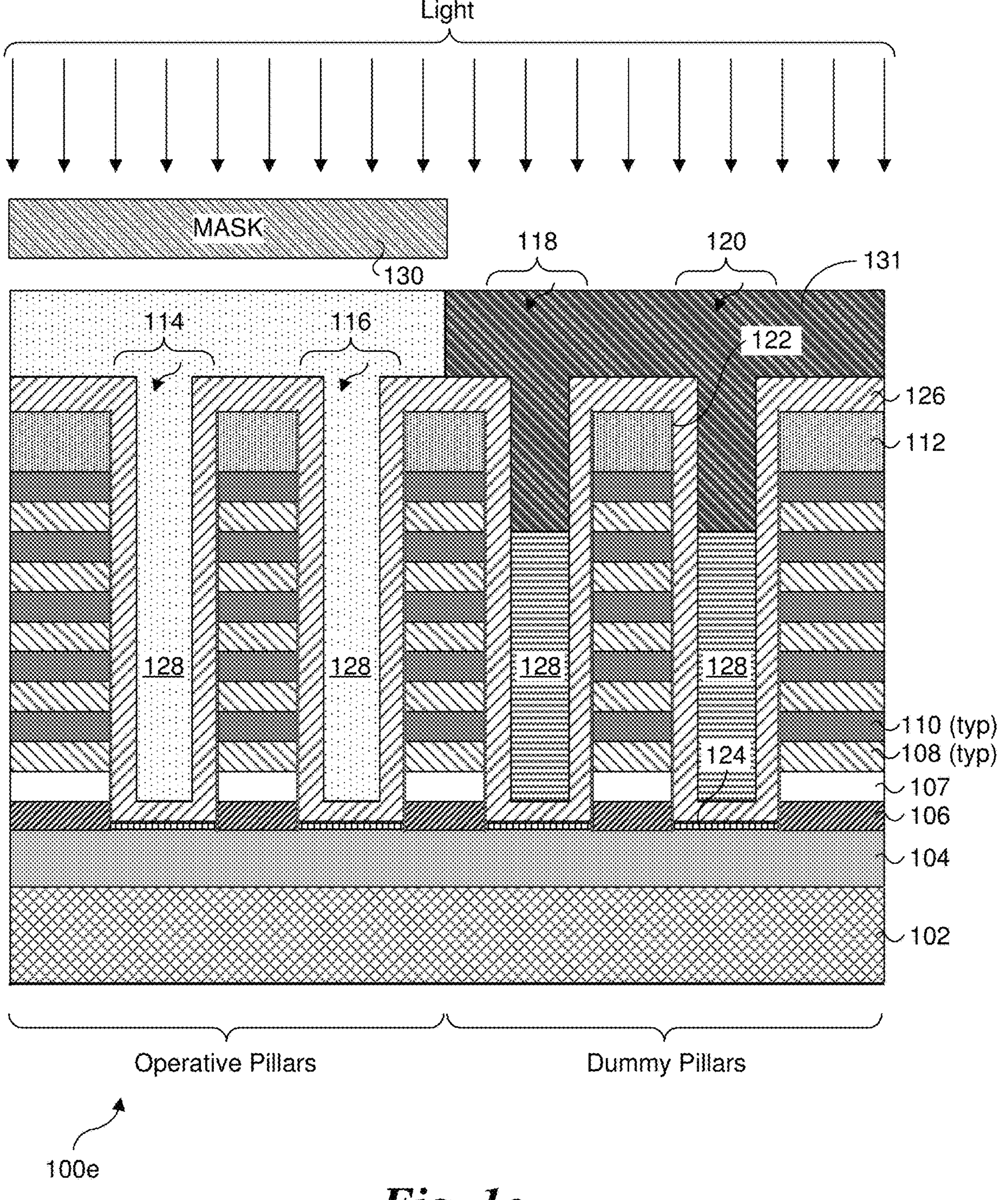
Figure 1F:
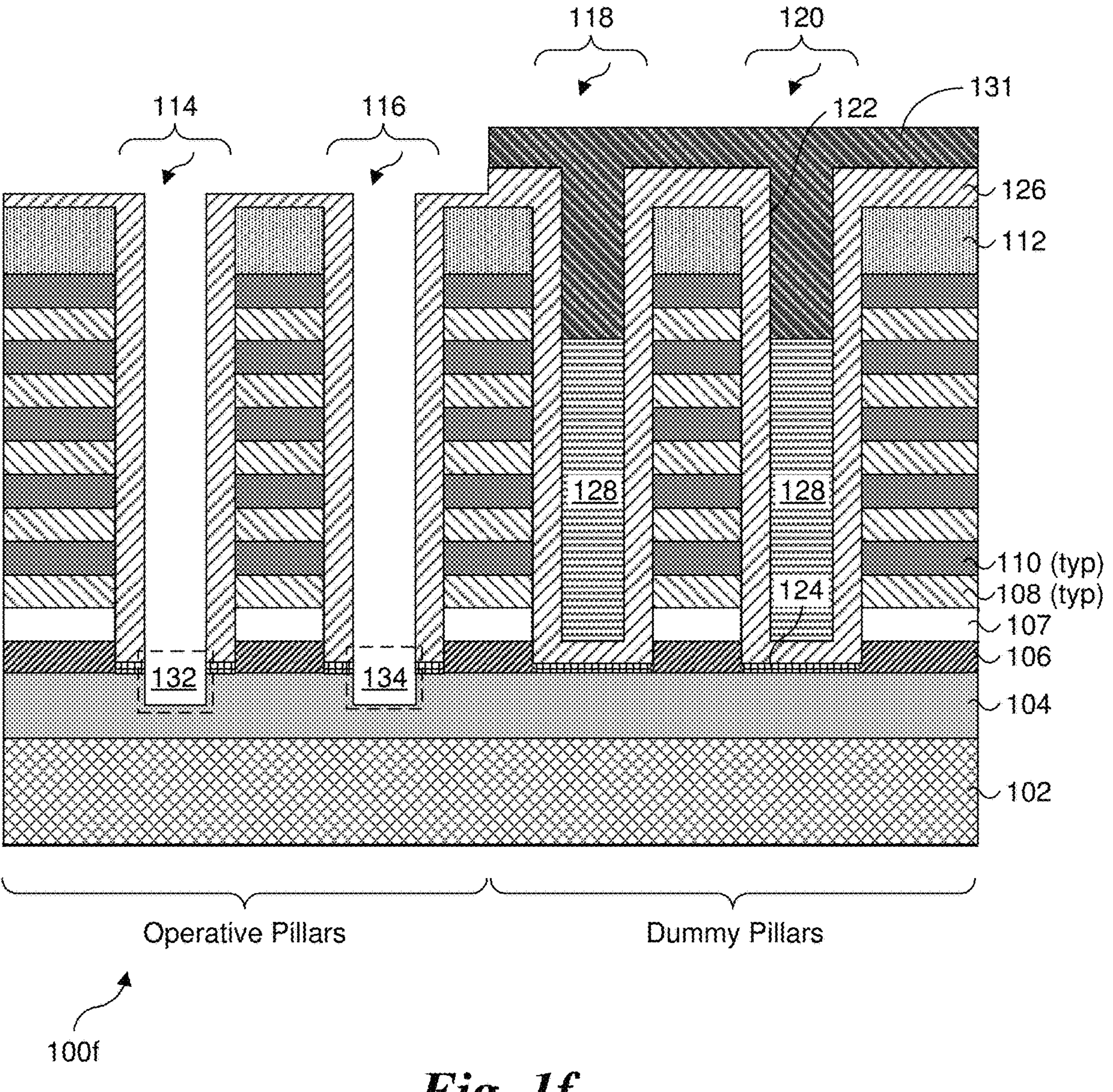
Figure 1G:
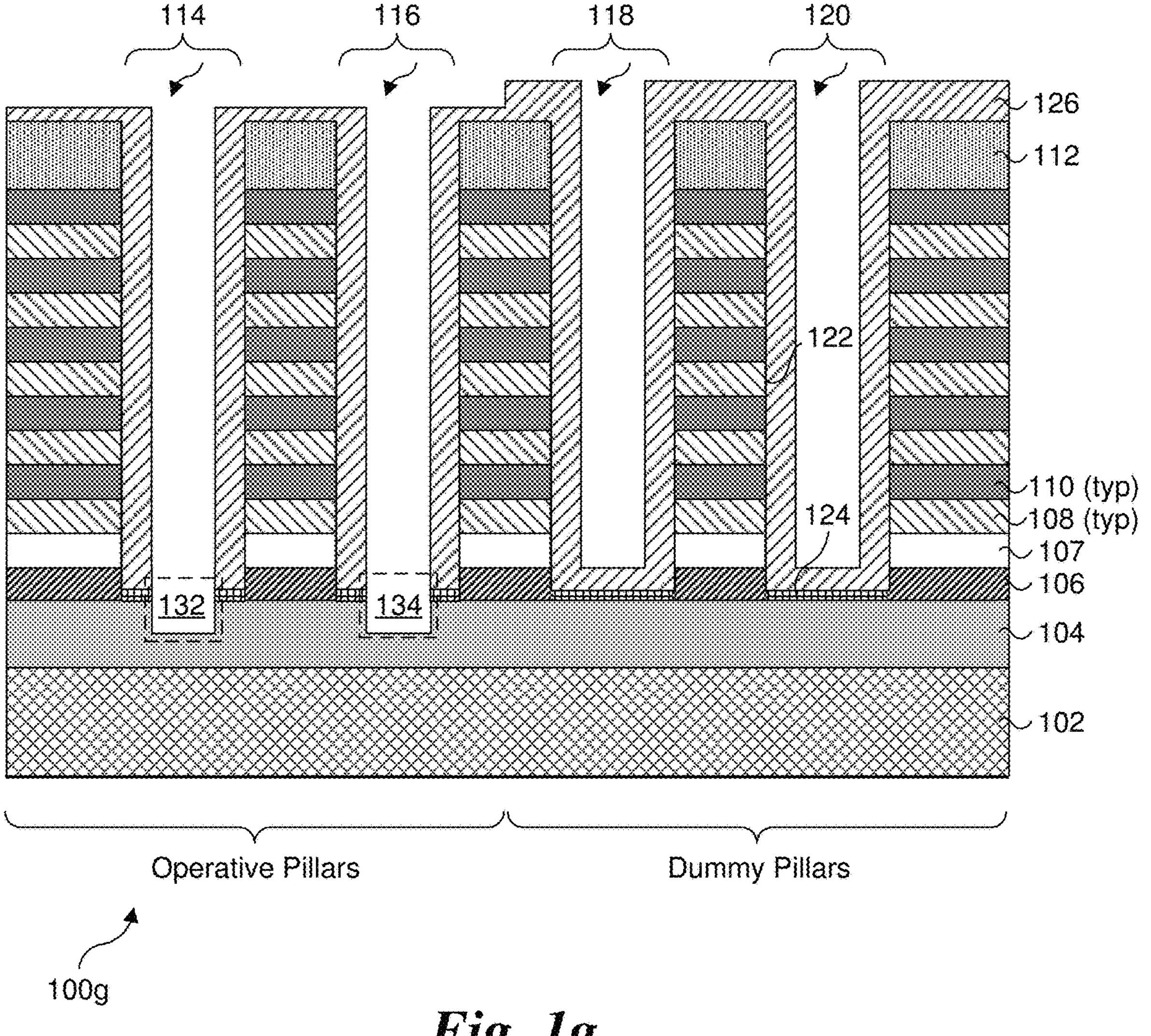
Figure 1H:
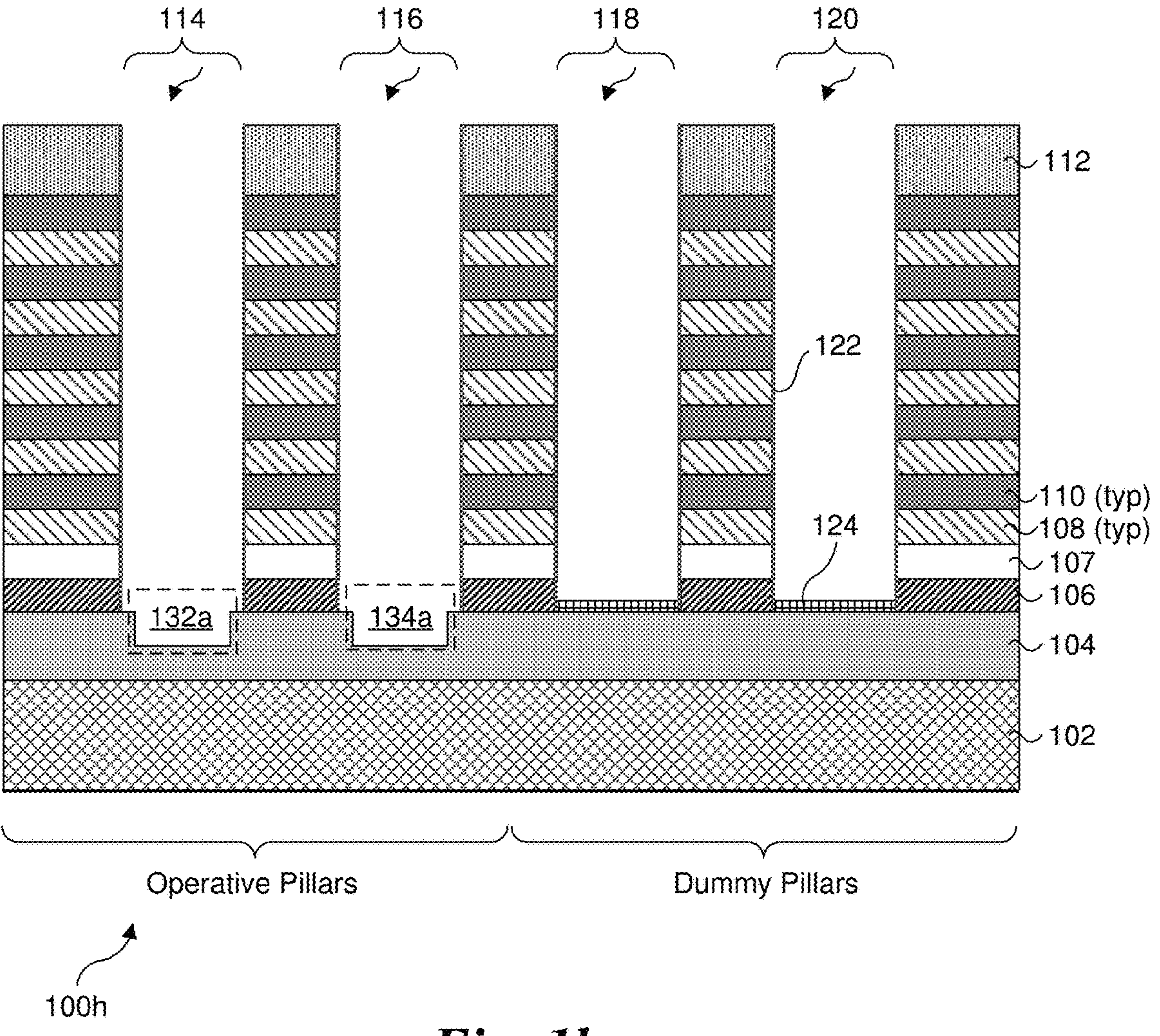
Figure 2:
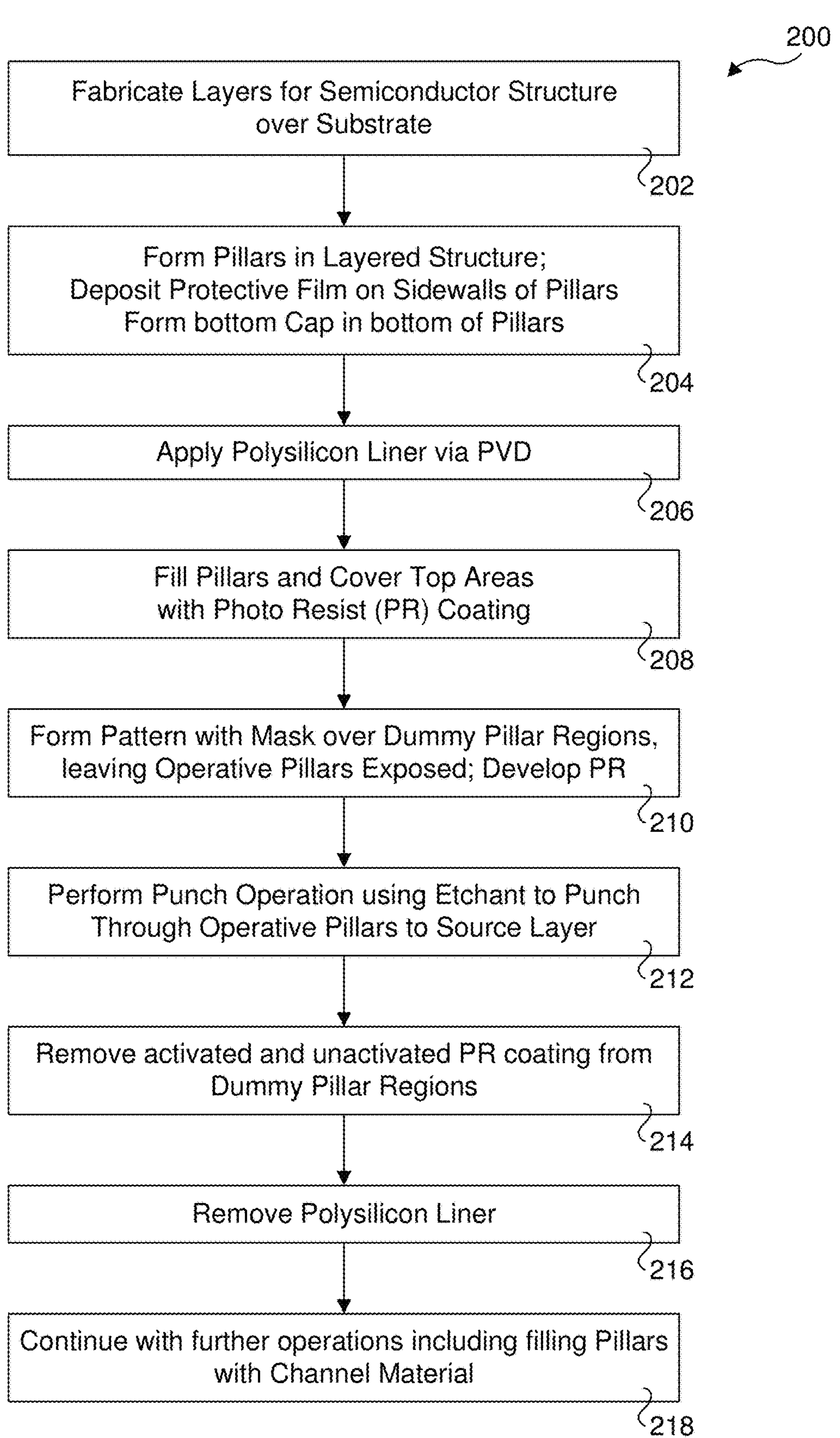
FIG. 2 is a flowchart illustrating operations for fabricating the semiconductor structures of FIGS. 1*a*-1*h*, according to one embodiment.

FIGS. 1*a*-1*h* illustrate processing operations used to fabricate a semiconductor structure, according to one embodiment, with corresponding operations shown in a process flow 200 in FIG. 2. As depicted in a block 202, the first operation is to fabricate layers for the semiconductor structure over a substrate (not shown). FIG. 1*a* shows a structure 100*a* the includes a source layer 102, a source (SRC) polycrystalline silicon layer 104, an insulator (e.g., $SiO_x$ of $SiN_xO_y$) layer 106, a source gate source (SGS) polycrystalline silicon layer 107 a plurality of alternating conductive and insulative layers 108 and 110, and a top layer 112. As further shown in FIG. 1*b*, each pair of conductive and insulative layers 108 and 110 comprises a tier, and a stack of tiers comprises a deck. In one embodiment, conductive layers 108 comprise a tier polycrystalline silicon layer and insulative layers 110 comprise a tier oxide layer (e.g., $SiO_x$). In one embodiment, top layer 112 comprises a non-metal nitride, such as SiN or $Si_3N_4$. Generally, structure 100*a* may be fabricated using known semiconductor processing steps and equipment.

Polycrystalline silicon is also called "polysilicon" or simply "poly" for short. Also, in the Figures herein different layers of polycrystalline silicon may have different chemical/molecular compositions, and include elements that are not silicon, such as due to impurities and/or doping. Moreover, the following semiconductor structures and features are for illustrative purposes and generally are not drawn to scale but rather the aspect ratio of features such as pillars are dramatically widened to better fit text descriptors and to better illustrate different materials.

In a block 204, pillars are formed in the layered structure. Generally, the pillars will be formed in a pattern using conventional techniques such as using a patterned mask and an etchant. Once the pillar recesses are formed, a dielectric film or coating is deposited/formed on the sidewalls of the pillars and caps are formed at the bottom of the pillars. The result of these operations is illustrated in FIG. 1*b*, which shows a structure 100*b* after the operations in block 204 are performed on structure 100*a*. First, multiple pillars 114, 116, 118, and 120 are formed in structure 100*a*, as illustrated, where the depth of the pillars stop at the top of SRC polysilicon layer 104. Next, a dielectric material 122 is deposited to line the sidewalls and the bottom of the pillars. Examples of dielectric materials include $SiO_x$ or $SiN_xO_y$. A layer of an insulator or dielectric material 124 is then deposited in the bottom of each of pillars 114, 116, 118, and 120. In one embodiment, the insulator or dielectric material comprises $SiO_x$ or $SiN_xO_y$.

As shown for a structure 100*c* in FIG. 1*c* and a block 206 of process flow 200, a polysilicon liner 126 is deposited along the sidewalls and bottoms of pillars 114, 116, 118, and 120, and above the layer of insulator or dielectric material 124. The polysilicon liner may be fabricated using known processes, such as physical vapor deposition (PVD).

As shown in FIG. 1*d* and in a block 208, a negative resist (PR) coating 128 is applied to structure 100*c* to obtain a structure 100*d*. The PR coating 128 may comprise [what material] and may be applied using known operations. The result of this operation is to fill the pillars recesses and cover the top of layer 112 with PR coating 128.

Next, in a block 210 a pattern is formed with a mask over the dummy pillar regions, leaving the operative pillars exposed. This is shown for a structure 100*e* in FIG. 1*e*, where a mask 130 is used to prevent light from reaching the PR coating in the operative pillar region and a developer is used to dissolve PR coating 128, which activates the portion of PR coating 128 that is exposed to produce polymerized PR coating 131, which is insoluble to the developer. Meanwhile the portion of PR coating 128 for the operative pillar region is soluble to the developer, and once developed this portion of PR coating 128 (now shown with a lighter pattern) will be dissolved and removed.

In a block 212 a "punch" operation is performed that results in the etchant punching through a portion of layer 124 and SRC polysilicon layer 104 for pillars 114 and 116, as depicted by punch through regions 132 and 134. As shown in a structure 100*f* in FIG. 1*f*, the etchant also removes a portion of polysilicon liner 126 above the operative pillars and a portion of activated PR coating 131, which is partially resistant to the etchant. Next, in a block 214, an operation is performed to remove the activated portion 131 of the PR coating and the unactivated portion of PR coating 128 in the dummy pillar region The resulting structure 100*g* following the operations of block 214 is shown in FIG. 1*g*.

As shown in a block 216, the last operation employs an etchant to remove the remainder of polysilicon liner 126 to obtain a structure 100*h* shown in FIG. 1*h*. This also results in widening punch through regions 132 and 134, as shown by punch through regions 132*a* and 134*a*. For dummy pillars 118 and 120, the etchant stops at layer 124.

As depicted in a block 218, following the foregoing operations, additional operations are performed to fabricate the semiconductor structure, including filling pillars 114, 116, 118, and 120 with a channel material as further illustrated below.

Figure 3:
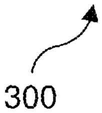
FIG. 3 is a block diagram of an embodiment of a stacked circuit having a multiple tiers of circuit elements.

FIG. 3 is a block diagram of an embodiments of a stacked circuit used to further illustrate circuit element tiers in a 3D memory structure. FIG. 3 shows a circuit 300 that represents a cross section of an electronic circuit, and it will be understood that typically many such circuits would be processed simultaneously on a semiconductor wafer. Substrate 310 represents a substrate or semiconductor platform on which the electronic circuit is processed. Substrate 310 is typically part of the wafer for processing. The processing creates (e.g., deposits) a source conductor 312 on or in substrate 310. Source conductor 312 can activate or control the circuit operation of circuit elements 322 of circuit 300. Source conductor 312 includes a highly conductive (low resistivity) material, such as metallic material or other material with many high-mobility carriers. In one embodiment, source 312 is a multilayer structure. It will be understood that not all circuit elements for a functional circuit are illustrated in circuit 300.

Insulator 314 (elements 314-A and 314-B) can provide a barrier between source 312 and the multiple tiers of circuit elements 322 (elements 322-A and 322-B). The processing creates circuit elements 322 in tiers, such as by iteratively processing multiple layers of devices adjacent to each other. Typically, the functional circuit elements are separated by a layer of insulator between each tier of circuit elements. Channel 324 represents a common conductor for circuit elements 322, and extends the entire height/length of circuit elements 322 to source 312. Thus, channel 324 provides electrical connectivity from source 312 to circuit elements 322.

In one embodiment, the processing creates insulator 326 (elements 326-A and 326-B) on circuit elements 322 to provide a separation layer between circuit elements 322 and additional elements that may be processed on circuit 300. Such additional elements can include one or more additional decks of multiple tiers of circuit elements, signaling lines, and/or other elements. The processing creates channel cap 332 at the end of channel 324, and allows electrical connectivity of channel 324 to elements processed on circuit 300, and thus enables electrical connectivity of additional elements (not shown) to source 312. It will be understood that insulator 326 can be a single insulator layer that surrounds channel cap 332. Similarly, channel 324 can be surrounded by circuit elements 322. Thus, the designation of 'A' and 'B' elements is merely for illustrative purposes for the illustrated cross section, to illustrate the different sides of the circuit as seen from a cross section.

In one embodiment, the depth of recess for channel cap 332 can be controlled for different applications. Channel cap 332 includes a metallic material to be highly conductive. In one embodiment, the material is a metal, which could be but is not limited to tungsten (W), titanium (Ti), cobalt (Co), or others. In one embodiment, the material includes a metal silicide, which could be but is not limited to tungsten silicide ($WSi_x$), titanium silicide ($TiSi_x$), cobalt silicide ($CoSi_x$), or others. In one embodiment, the material includes a metal oxide, which could be but is not limited to titanium oxide ($TiO_x$), cobalt oxide ($CoO_x$), zinc oxide ($ZnO_x$), zirconium oxide ($ZrO_x$), halfnium oxide ($HfO_x$), or others. Each of the metals, metal nitrides, and metal oxides can be selectively grown on channel 324. In one embodiment, channel 324 includes highly doped polysilicon, which provides the ability to selectively grow material with known techniques (techniques for selective metallic growth on silicon).

It will be understood that chemical formula representations such as $WSi_x$ or $TiO_x$ (and others used herein) are generic representations of a chemical compound rather than a specific chemical formula. Each representation refers to a metal or metallic atom as the first element with a second element following. The 'x' at the end of the chemical formula representation indicates that the compound will include one or more of the first atom combined with one or more of the second atom. The exact numbers of each atom of the various compounds could vary by implementation and/or processing technique, and is thus not specified herein.

Figure 4:
FIG. 4 is a block diagram of an embodiment of a stacked circuit including a stop layer between decks of circuit elements.

FIG. 4 is a block diagram of an embodiment of a stacked circuit in which a selectively created channel cap provides a stop layer between decks of circuit elements. Circuit 400 represents a portion of an electronic circuit device that uses multiple decks of circuit elements, and can be a circuit in accordance with circuit 300 of FIG. 3. Instead of processing all circuit elements in a single 3D stack and attempting to create a channel to activate all the circuit elements, the processing creates circuit 400 in layers, with multiple decks of circuit elements.

Substrate 410 represents a substrate or semiconductor platform on which the electronic circuit is processed. Circuit 400 represents a cross section of the electronic circuit, and it will be understood that what is represented could be merely a small portion of an individual circuit device, and that multiple of the same circuit devices can be processed in parallel. The processing creates (e.g., deposits) source conductor 412 on substrate 410, wherein source 412 provides a source of charge carriers to the conductive channels to enable them to provide an electrical potential to activate the circuit elements.

Insulator 414 (elements 414-A and 414-B) can provide a barrier between source 412 and the first deck, deck 420. Deck 420 includes circuit elements 422 (elements 422-A and 422-B). The processing creates circuit elements 422 in tiers within deck 420. Thus, circuit 400 includes multiple circuit elements 422 stacked adjacent to each other within deck 420. Deck 420 can include anywhere from a few circuit elements 422 to more than 30 circuit elements (e.g., 36 or 38 memory cells), depending on the geometries of circuit 400 and the capabilities of the processing techniques used. Channel 424 extends the entire height/length of deck 420 to source 412, to provide electrical connectivity from source 412 to circuit elements 422.

The processing creates insulator 426 (elements 426-A and 426-B) on deck 420, which is a separation layer for circuit 400. The processing also creates a conductive channel cap that functions as stop layer 430. Stop layer 430 provides electrical connectivity of channel 444 of deck 440 to channel 424 of deck 420, and thus to source 412.

In one embodiment, the processing creates deck 440 as a second deck for circuit 400, adjacent to deck 420. Deck 440 includes circuit elements 442 (elements 442-A and 442-B). It will be understood that the multiple tiers of circuit elements, 422 and 442, can be processed in steps or layers. Thus, the number of tiers desired can determine how many layers of processing are performed. In one embodiment, circuit elements 422 and 442 are each stacked vertically as tiers of circuit elements within their respective decks. In one embodiment, the processing that creates circuit elements 442 is the same as the processing that creates circuit elements 422, but performed in a different deck separated by certain decks processing operations.

In one embodiment, the metallic material used for stop layer 430 and/or the depth of etch to create stop layer 430 provides good conductivity to interconnect channel 444 to channel 424, and can enable a deterministic stopping point for an etch process that creates channel 444. While not specifically shown, channel 444 can also have a channel cap selectively grown on it. In one embodiment, the processing uses different processes to selectively grow the channel cap represented by stop layer 430 and a channel cap on channel 444. For example, the processing can create stop layer 430 as a layer selectively grown in a recess on channel 424, and then create a channel cap on channel 444 as a cap selectively grown on the poly or other material that makes up channel 444. Stop layer 430 provides an ohmic contact between the channel and the conductive material of the channel cap. In one embodiment, the type of channel cap (e.g., recessed and non-recessed) could be reversed for stop layer 430 and a channel cap on channel 444. The processing creates the channel caps as interconnections within the channel and/or as contacts to access a conductive channel. By selectively growing the channel cap, the processing does not require CMP or other processing to isolate the contacts. Instead, the channel caps are prepared as contacts simply by the selective creation process. Thus, the creation of the channel cap does not result in polishing artifacts in circuit 400.

Circuit 400 explicitly illustrates two decks, deck 420 and deck 440. It will be understood that the separation of the elements in the different decks, as well as the high conductivity of channel 424, channel 444, and selectively grown stop layer 430 theoretically allows any number of decks to be stacked in a circuit. Thus, the total number of circuit elements in circuit 400 can be doubled, tripled, or more, relative to what the real estate would traditionally allow, based on the stacking. The use of selective growing of stop layers can provide a more commercially viable process for high volume implementation.

Figure 5:
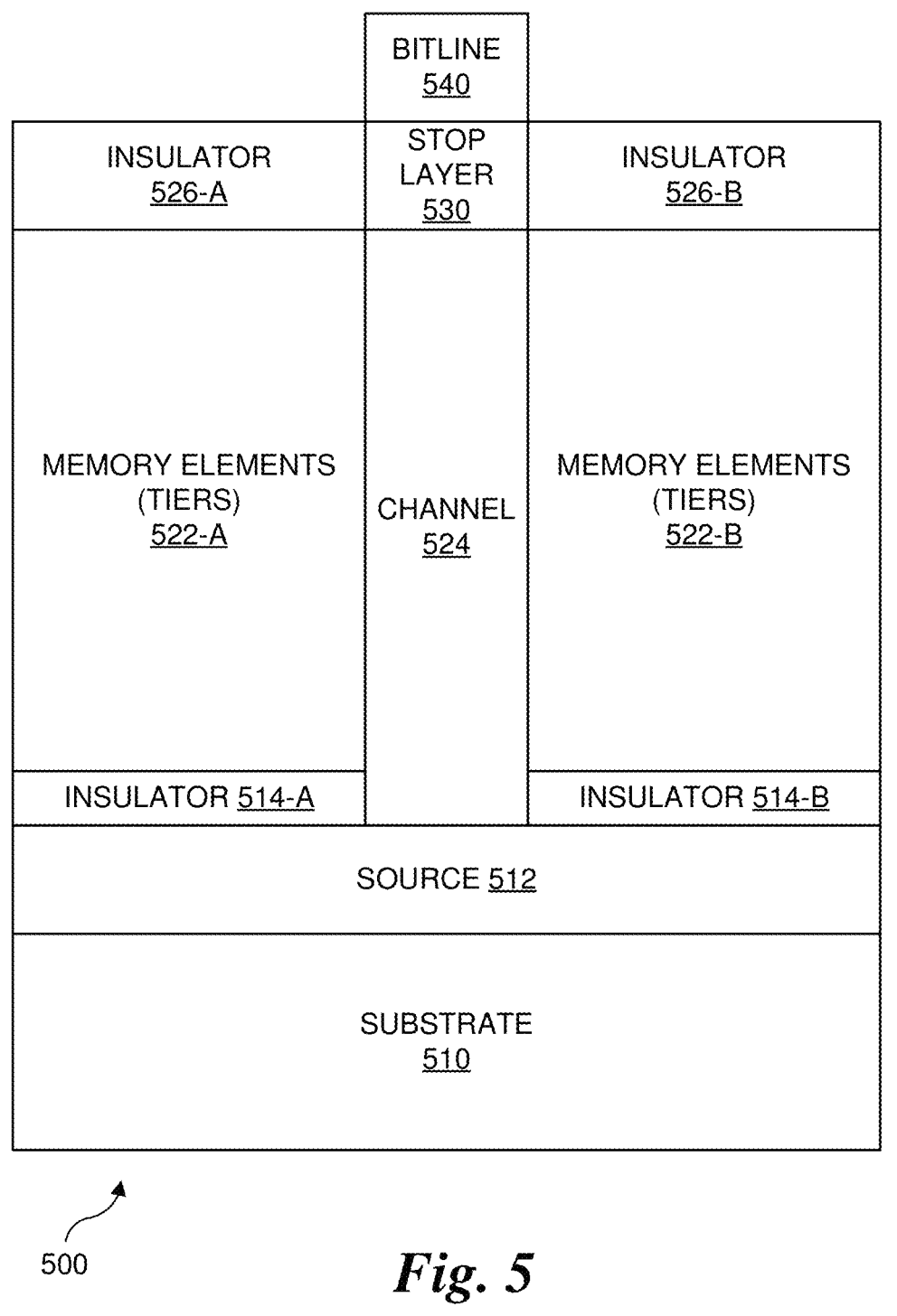

FIG. 5 is a block diagram of an embodiment of a stacked memory circuit in which a selectively created channel cap provides a contact between the channel and a bitline. Circuit 500 represents a portion of an electronic circuit device that uses multiple decks of circuit elements, and can be a circuit in accordance with circuit 300 of FIG. 1. It will be observed that circuit 500 includes similar elements to those illustrated and described with reference to circuit 400 of FIG. 4. The discussion of components 410, 412, 424, 426, and 430 of circuit 400 applies equally well to components 510, 512, 514, 524, 526, and 530, respectively, of circuit 500. In one embodiment, the circuit elements of circuit 500 are memory elements 522 (elements 522-A and 522-B) formed above insulator 514-A and 514-B. Memory elements 522 represent tiers of memory cells configured in a stacked circuit. The 3D configuration of circuit 500 enables greater density for the memory cells.

In one embodiment, stop layer 530 of circuit 500 provides a contact for bitline 540. Bitline 540 can charge memory elements 522 by charging channel 524 via stop layer 530. Thus, stop layer 430 of circuit 400 connects channel 424 to channel 444 of deck 440 processed on deck 420, and stop layer 530 of circuit 500 connects channel 524 to bitline 540. It will be understood that while labeled specifically as a bitline, bitline 540 can represent any signal line that might be connected to channel 524. It will be understood that circuit 500 can include many memory elements 522 in parallel with multiple different channels. Each channel can be connected to different signal lines, or multiple channels can be connected to the same signal lines. In one embodiment, circuit 500 includes a select gate between bitline 540 and stop layer 530.

Figure 6A:
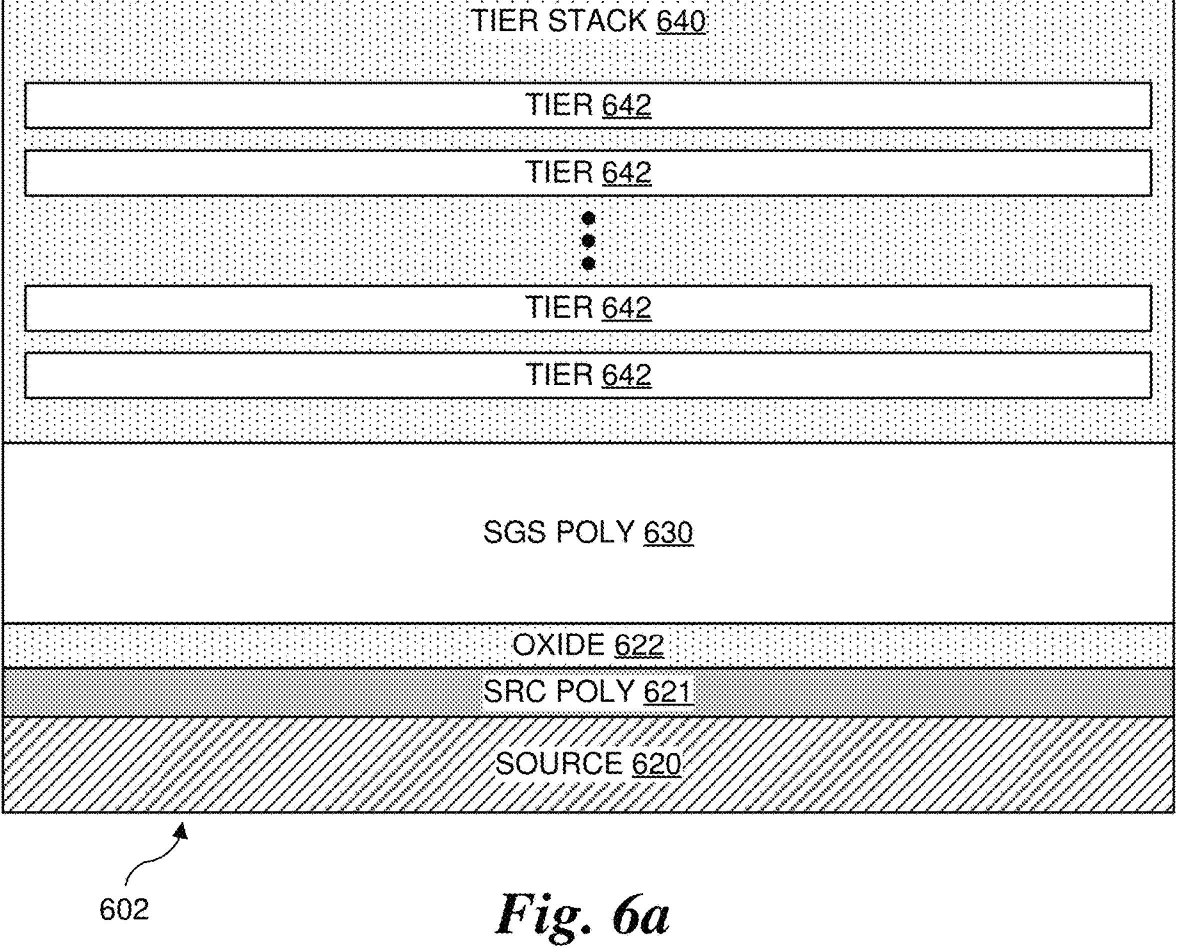
FIGS. 6*a*-6*c* are block diagrams of embodiments of states of a stacked circuit with an operative pillar having a punch through and a dummy pillar having a bottom cap.
Figure 6B:
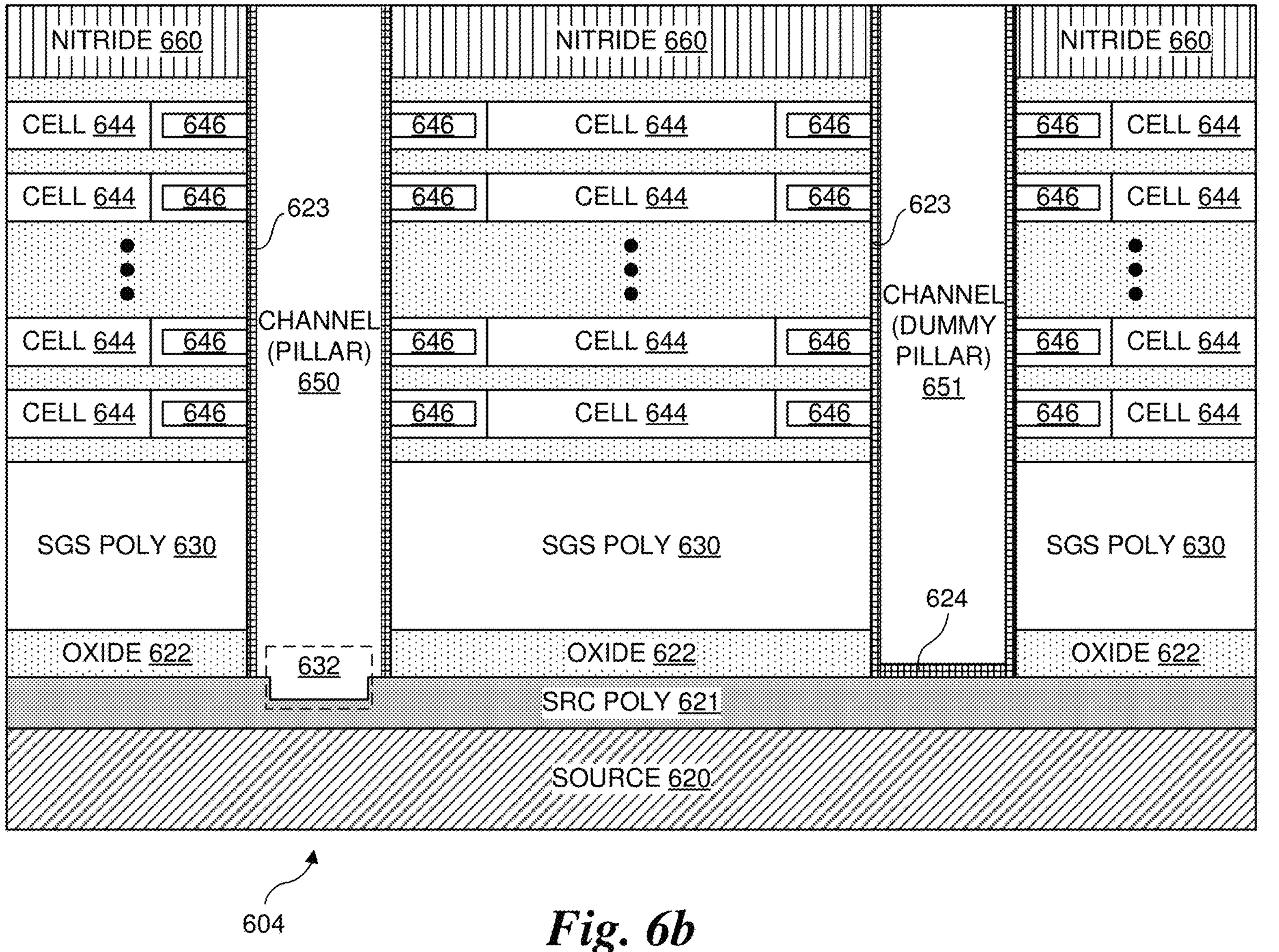
Figure 6C:
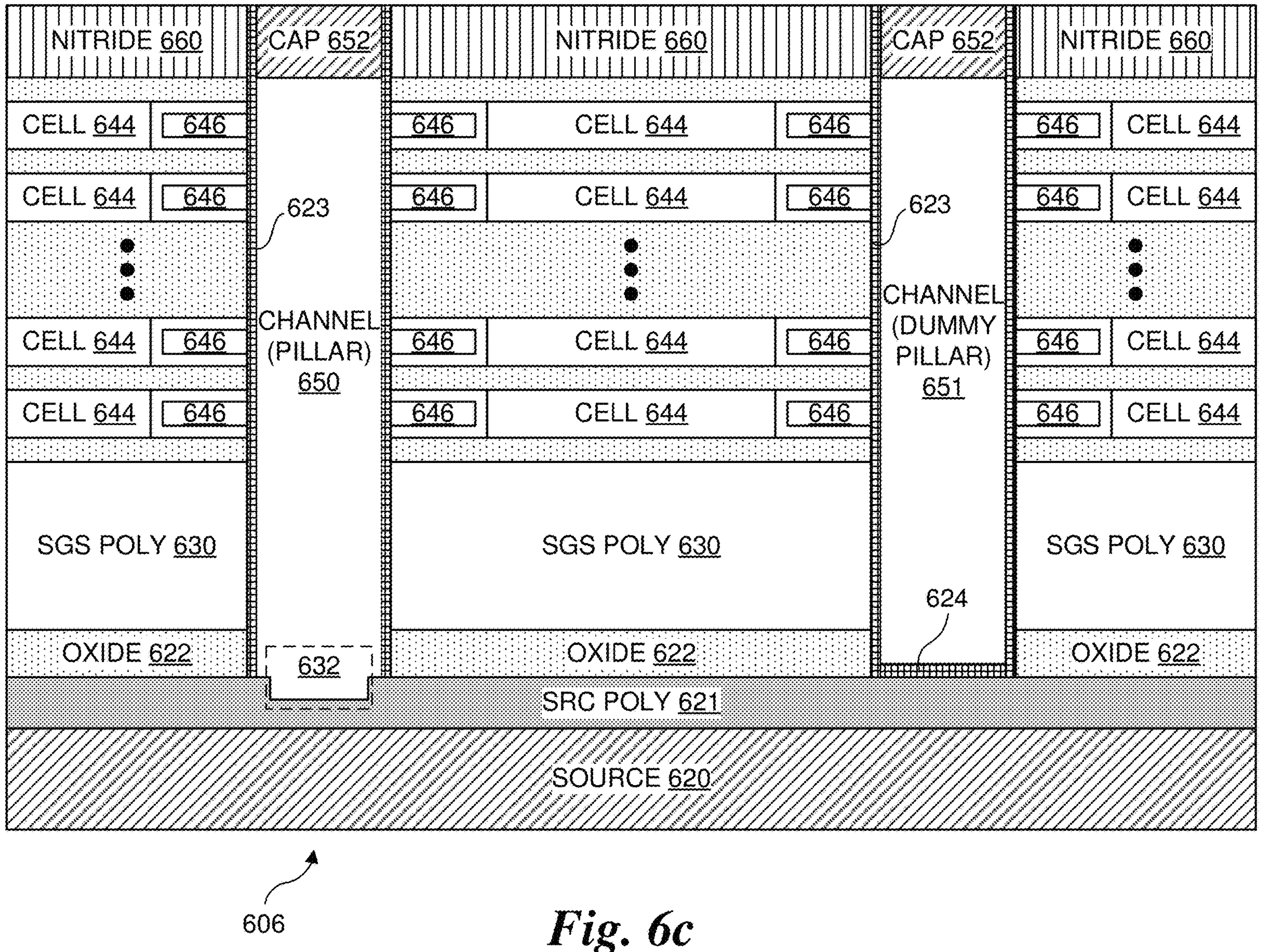

FIGS. 6*a*-6*c* are block diagrams of embodiments of states of a stacked circuit with a selectively created channel cap. For purposes of example, FIGS. 6*a*-6*c* illustrate a three-dimensional stacked memory device, with each deck having multiple tiers of memory cells. Specifically, the example in FIGS. 6A-6C provide example embodiments of a vertically stacked memory device, with multiple vertical tiers of memory cells. The circuit states illustrated in FIGS. 6*a*-6*c* can apply to any embodiment of a stacked circuit with a channel cap described herein, such as circuits 300, 400, or 500. In one embodiment, the processing will generate another deck of multiple tiers of memory cells vertically adjacent the deck created. In one embodiment, the processing can occur in a "horizontal" manner, but for a device that is stacked out from a semiconductor substrate or wafer. Thus, in one embodiment, "vertical" stacking can refer to any processing that extends circuit elements out or up and away from the semiconductor substrate on which the devices are processed and/or placed for operation. Such processing allows reduced area in a plane of the semiconductor substrate to which the devices are connected, while increasing the number of devices stacked out from the semiconductor substrate.

FIG. 6*a* illustrates circuit state 602, in which multiple tiers 642 are processed over source 620 and a SRC polysilicon layer 621. In one embodiment, oxide 622 provides a separation between the metallic material of source 620 and the doped poly material of SGS poly 630. SGS poly 630 represents a select gate that can be used to activate memory cells in tier stack 640. In one embodiment, oxide 622 includes a specific compound, such as a metal oxide, to control etching and contact of a conductive channel to source 620. In one embodiment, tier stack 640 includes oxide as an inter-tier insulator that isolates one tier 642 from another. Stack 640 can include any number of tiers 642. In one embodiment, oxide 622 is the same material as an oxide used as an inter-tier insulator. In one embodiment, oxide 622 is a different material than the oxide used as an inter-tier insulator. For purposes of simplicity, the substrate is not illustrated in circuit state 602, but source 620 will be understood to be processed in or on a substrate.

FIG. 6B illustrates circuit state 604, in which the processing creates the hollow channel conductor. In one embodiment, the processing creates channels 650 and 650 through the multitier stack of memory elements by creating a punch etch, cleaning the pillar, and depositing a dielectric material 623 along the sides of the pillar and a cap 624 at the base of channel 651. In one embodiment, channel 650 includes a single conductive material (such as polysilicon), but could alternatively be a polysilicon or metallic material on the base and side that surround an oxide or insulator in the inner part of the channel. As illustrated, channels 650 and 651 are solid channels. Channel 650 extends from one end of the multitier stack down to source 620 to provide ohmic contact with source poly 621, as depicted in punch-through area 632. In contrast, cap 624 in channel 651 functions as an insulator and prevents ohmic contact with source poly 621. Thus channel 651 is a dummy pillar.

Circuit state 604 more specifically labels the multitier stack as cells 644. In one embodiment, each cell 644 includes a floating gate 646 to activate the cell. Gates 646 connect to channels 650, allowing channel 650 to conduct charge that will activate gates 646 to provide access to cells 644. Nitride 660 represents a circuit capping layer, which insulates the multitier stack of memory cells from other processing that will finish the circuit. In one embodiment, nitride 660 is an insulator or insulation layer between the multitier stack of memory cells and another stack or another deck of memory cells processed vertically adjacent the multitier stack shown. Generally, nitride 660 is a non-metal nitride. The physical composition of nitride 660 can be a material that allows growth of a channel cap at the end of the channel without growing the material anywhere on the capping nitride layer.

FIG. 6C illustrates circuit state 606, in which the processing creates a channel cap or conductive cap with a recessing operation. The processing first creates a recess via etch or another process, and then fills the recess with the material for cap 652. Cap 652 is selectively grown by a process of selective deposition or other selective operation that can grow or deposit material in one area of the circuit but not another. The recessing of channel 650 causes the exposure of material of one type (the material of channel 650) that is different from nitride 660 or other capping or insulator layer. The processing uses techniques of chemical combinations and controlled temperature environments to create a metallic material to form cap 652 while not creating any metallic material on nitride 660. The nitride has different physical properties from channel 650, which allows the selective metallic growth of cap 652. While cap 652 is illustrates as having approximately the same thickness as nitride 660, it will be understood that cap 652 can be the same thickness or be thinner or thicker than nitride 660. The thickness of cap 652 depends on the processing used to selectively create cap 652 based on the implementation intended for the circuit. Significantly, the creation of cap 652 does not deposit material outside of the area intended for cap 652 (i.e., at the end of channel 650), and there may be no need for polishing or other processing to remove excess material. The lack of polishing can prevent the introduction of processing artifacts while creating cap 652. Specifically, polishing artifacts can be eliminated.

Figure 7:
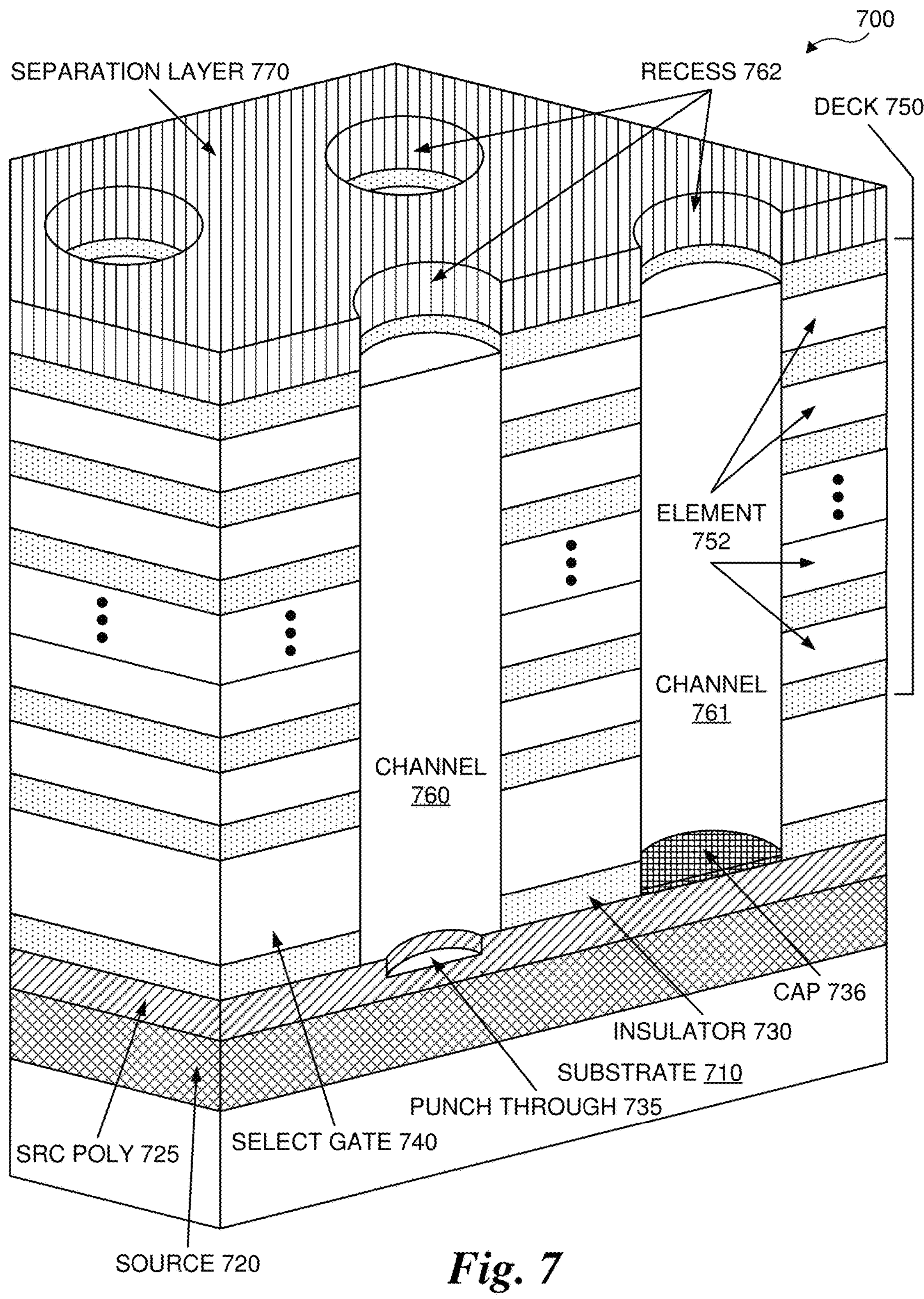
FIG. 7 is a perspective view of an embodiment of a stacked circuit with an operative pillar having a punch through and a dummy pillar having a bottom cap.

FIG. 7 is a perspective view block diagram of an embodiment of a stacked circuit with a recess on the channel for a channel cap. Circuit 700 can be one example of a stacked circuit with a recessed channel cap in accordance with any embodiment described. For example, circuit 700 can be one example of circuits 300, 400, 500, or the circuit illustrated in FIGS. 6*a*-6*c*. Circuit 700 illustrates a cross-sectional perspective view of an embodiment of a stacked circuit.

Substrate 710 represents a semiconductor substrate (such as a silicon substrate) on which circuit 700 is processed. Source 720 represents a conductive layer that provides charge carriers to channel 760 via SRC poly 725. Insulator 730 represents a layer that separates SRC poly 725 from select gate 740. Select gate 740 represents a layer of conductive material that can provide control in activating circuit elements 752 of deck 750. Deck 750 represents a number of tiers of circuit elements 752, which can be formed as alternating layer of circuit elements separated by oxide or other insulator layers. Channel 760, which corresponds to an operative pillar, extends from one end of deck 750 to form an ohmic contact with SRC poly 725 in punch through area 735. Meanwhile, cap 736 formed in the bottom of channel 761 prevents ohmic contact with SRC poly 725; thus, the pillar with channel 761 is a dummy pillar.

Separation layer 770 represents a nitride layer or other layer that separates deck 750 from other circuit components processed on the multiple tiers. Recesses 762 represent recesses formed in separation layer to expose channels 760. In one embodiment, the structures are cylindrical as illustrated. It will be understood that while round geometries are common, other geometries might be used. In one embodiment, recesses 762 extend through separation layer 770 and into an oxide layer or otherwise into deck 750 to expose channel 760. The depth of recesses 762 can be controlled, and for example can be shallower than what is shown.

Figure 8:
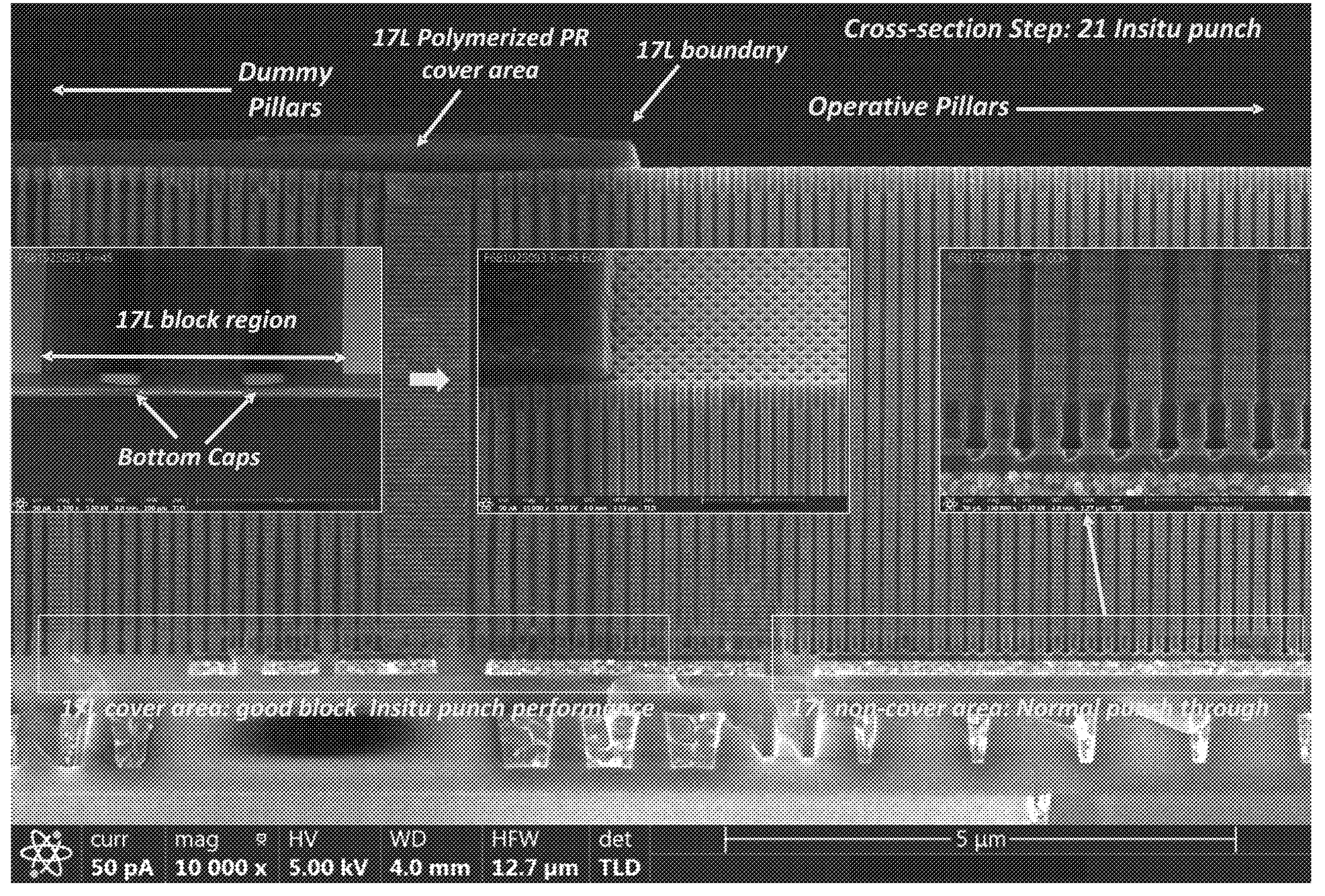
FIG. 8 shows images produced by a scanning electron microscope of a semiconductor structure to which the process flow described herein have been applied.

FIG. 8 shows images produced by a scanning electron microscope of a semiconductor structure to which the process flow described above has been applied. The larger image in the background and zoomed images in the foreground are cross-section images of the semiconductor structure. As shown, the dummy pillars on the left-hand side are covered with polymerized photoresist, while the operative pillars on the right-hand side are uncovered. The zoom image on the left side shows the structure of a dummy pillar including the bottom caps. The zoomed image on the right side shows the punch through structure, while the zoomed image in the middle shows a 3D view of the upper portion of the semiconductor structure. As further shown in these images, the aspect ratio of pillars (height to width) is very large.

Using the semiconductor fabrication process flows described and illustrated herein, the structural integrity of the semiconductor structure is enhanced by selective use of dummy pillar regions in the semiconductor die. By fabricating dummy pillars in selective regions (e.g., regions identified as weak when dummy pillars are not used), losses resulting in poor yields can be dramatically reduced or eliminated entirely. Moreover, the fabrication process flow illustrated and described herein is a low-cost approach that solves the yield problem without requiring expensive masks and associated fabrication techniques.

Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In the Figures, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method for fabricating a semiconductor device, comprising:

forming a plurality of pillar recesses in a semiconductor structure comprising a plurality of layers;

depositing a bottom cap material to form bottom caps at the bottoms of the plurality of pillar recesses;

applying a negative photoresist coating over regions containing the plurality of pillar recesses;

exposing the negative photoresist coating using a mask to expose the negative photoresist coating in regions in which dummy pillars are to be formed, including causing an unexposed area of the negative photoresist coating to polymerize and become insoluble to a developer; and applying the developer to the semiconductor structure to dissolve the negative photoresist coating in one or more first pillar recesses that are not exposed, the one or more first pillar recesses configured to provide operative pillars;

using an etchant to punch through the bottom caps in the one or more first pillar recesses;

wherein polymerized photoresist prevents the etchant from reaching the bottom caps formed in one or more second pillar recesses corresponding to the dummy pillars.

2. The method of claim 1, wherein:

after the plurality of pillar recesses are formed in the semiconductor structure, the bottom cap material is deposited to form the bottom caps at the bottoms of the plurality of pillar recesses; and after applying of the developer and dissolving of the negative photoresist coating in the one or more first pillar recesses corresponding to the operative pillars, the etchant is used to punch through the bottom caps in the one or more first pillar recesses.

3. The method of claim 1, further comprising:

applying a polysilicon lining to line sidewalls of the plurality of pillar recesses following forming the bottom caps at the bottoms of the plurality of pillar recesses.

4. The method of claim 1, further comprising:

following using the etchant to punch through the bottom cap material of the one or more first pillar recesses, removing the polymerized photoresist and unpolymerized photoresist from the one or more second pillar recesses corresponding to the dummy pillars.

5. The method of claim 1, wherein the plurality of layers include a source layer that is punched into for providing the operative pillars, the method further comprising:

filling the plurality of pillar recesses with a channel material; and forming metallic caps over the channel material in the plurality of pillar recesses, wherein the channel material enables the metallic caps in the operative pillars to be conductively coupled to the source layer.

6. The method of claim 5, wherein the source layer that is punched through comprises a source polycrystalline layer that is layered above a metallic source layer.

7. The method of claim 1, wherein the plurality of layers include a source material that is partially punched through for the operative pillars.

8. The method of claim 1, wherein the plurality of layers include a deck of alternating conductive layers and dielectric layers, wherein the conductive layers are used to form memory cells.

9. The method of claim 2, wherein the photoresist coating comprises a negative photoresist coating.

10. The method of claim 1, wherein the semiconductor structure is a three-dimensional (3D) memory structure.

11. The method of claim 1, further comprising selectively locating dummy pillar regions at weak points.

12. A method for fabricating a semiconductor structure;

forming a plurality of pillar recesses in a semiconductor structure comprising a plurality of layers formed over a substrate;

forming bottom caps in the pillar recesses;

depositing a liner material into the pillar recesses and over a top layer of the semiconductor structure;

applying a photoresist coating over the liner material;

employing a mask, developer, and light to selectively remove the photoresist coating from one or more first pillar recesses corresponding to operative pillars, while covering one or more second pillar recesses corresponding to dummy pillars with polymerized photoresist;

performing an etch operation using an etchant to punch through at least a portion of the bottom caps in the one or more first pillar recesses corresponding to the operative pillars;

removing the polymerized photoresist and unpolymerized photoresist from the one or more second pillar recesses corresponding to the dummy pillars; and removing the liner material.

13. The method of claim 12, wherein the liner material comprises polycrystalline silicon.

14. The method of claim 12, wherein the bottom caps are composed of $SiO_x$ or $SiN_xOy$.

15. The method of claim 12, further comprising applying a dielectric film to at least sidewalls of the plurality of pillar recesses prior to depositing the liner material.

16. A method for fabricating a semiconductor device, comprising:

forming a plurality of pillar recesses in a semiconductor structure comprising a plurality of layers;

applying a negative photoresist coating over regions containing the plurality of pillar recesses;

exposing the negative photoresist coating using a mask to expose the negative photoresist coating in regions in which dummy pillars are to be formed, including causing an unexposed area of the negative photoresist coating to polymerize and become insoluble to a developer; and applying the developer to the semiconductor structure to dissolve the negative photoresist coating in one or more first pillar recesses that are not exposed;

wherein the plurality of layers include a source material that is partially punched through for providing operative pillars.

17. The method of claim 16, further comprising:

forming bottom caps at the bottoms of the plurality of pillar recesses; and applying a polysilicon lining to line sidewalls of the plurality of pillar recesses.

18. The method of claim 16, further comprising:

removing polymerized photoresist and unpolymerized photoresist from one or more second pillar recesses corresponding to the dummy pillars.

19. The method of claim 16, further comprising:

filling the plurality of pillar recesses with a channel material; and forming metallic caps over the channel material in the plurality of pillar recesses, wherein the channel material is configured to electrically couple the metallic caps in the operative pillars to the source material.

20. The method of claim 16, wherein the source material further includes a metallic source layer and a source polycrystalline layer disposed above the metallic source layer.

* * * * *